(12) United States Patent
Yu et al.

(10) Patent No.: US 7,704,092 B2
(45) Date of Patent: Apr. 27, 2010

(54) ELECTRONIC MODULE

(75) Inventors: Juhyun Yu, Hitachi (JP); Ryuta Takahashi, Hitachi (JP); Yoshinori Sunaga, Hitachinaka (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 12/422,623

(22) Filed: Apr. 13, 2009

(65) Prior Publication Data

US 2009/0203250 A1    Aug. 13, 2009

Related U.S. Application Data

(62) Division of application No. 11/439,134, filed on May 24, 2006, now Pat. No. 7,530,835.

(30) Foreign Application Priority Data

May 24, 2005    (JP)    ............... 2005-150724

(51) Int. Cl.
  *H01R 13/64* (2006.01)
  *G02B 6/36* (2006.01)
(52) U.S. Cl. ........................ 439/372; 385/92
(58) Field of Classification Search .......... 439/372; 385/88–92
  See application file for complete search history.

(56) References Cited

U.S. PATENT DOCUMENTS

| | | |
|---|---|---|
| 6,178,096 B1 | 1/2001 | Flickinger et al. |
| 6,872,094 B1 | 3/2005 | Murr et al. |
| 7,090,523 B2 | 8/2006 | Shirk et al. |
| 7,213,980 B2 * | 5/2007 | Oki et al. ................. 385/92 |
| 7,281,862 B2 | 10/2007 | Oen et al. |
| 2002/0167793 A1 | 11/2002 | Branch et al. |
| 2006/0239622 A1 | 10/2006 | Goffhe et al. |
| 2007/0232146 A1 * | 10/2007 | Yamakami ............. 439/638 |
| 2008/0146066 A1 * | 6/2008 | Ice ........................ 439/345 |

OTHER PUBLICATIONS

Juhyun Yu, Office Action, U.S. Appl. No. 11/439,134, Feb. 6, 2007, 5 pgs.
Juhyun Yu, Office Action, U.S. Appl. No. 11/439,134, Apr. 4, 2007, 7 pgs.
Juhyun Yu, Office Action, U.S. Appl. No. 11/439,134, Oct. 19, 2007, 6 pgs.
Juhyun Yu, Advisory Action, U.S. Appl. No. 11/439,134, Feb. 4, 2008, 2 pgs.
Juhyun Yu, Office Action, U.S. Appl. No. 11/439,134, Mar. 17, 2008, 6 pgs.
Juhyun Yu, Office Action, U.S. Appl. No. 11/439,134, Sep. 5, 2008, 6 pgs.
Juhyun Yu, Notice of Allowance and Fee(s) Due, U.S. Appl. No. 11/439,134, Jan. 12, 2009, 8 pgs.

* cited by examiner

*Primary Examiner*—Briggitte R Hammond
(74) *Attorney, Agent, or Firm*—Foley & Lardner LLP

(57) ABSTRACT

An electronic module is provided with a module body for being removably inserted into a cage; a latch member provided in the module body for engaging an engagement hole formed in the cage during insertion into the cage; a rotatable nail for engaging/disengaging the engagement hole of the cage and being rotatably provided in the module body so as to appear above and sink below a module body surface; and a control member provided in the module body for rotating the rotatable nail.

3 Claims, 8 Drawing Sheets

ELECTRONIC MODULE

The present application is a divisional application of U.S. application Ser. No. 11/439,134, filed May 24, 2006, which is based upon and claims the benefit of priority from Japanese Patent Application No. 2005-150724, filed May 24, 2005, the entire contents of all of which are incorporated herein by reference in its entirety.

BACKGROUND OF THE INVENTION

1. Field of the Invention

The present invention relates to an electronic module with a latch member that engages a cage.

2. Description of the Related Art

As shown in FIG. 16, an electronic module 41 is known, such as an optical transceiver to be removably inserted into a cage 40, in which latch members 43 which engage the cage 40 are respectively provided on both sides of a module body 42, so as to be spring-biased outwardly in the direction of width. Specifically, this electronic module 41 has plate-spring arms 44 on both sides respectively, with which are provided the latch members 43. The arms 44 each are fixed to the module body 42 at an end in an insertion direction, and freely formed at a tip. The tips of the arms 44 are pushed and narrowed to thereby move the latch members 43 inwardly in the direction of width, and disengage the cage 40. This allows the lock to be released by pinching the pair of right and left arms 44 (see U.S. Pat. No. 6,178,096B1).

However, the above electronic module 41 bends the arms 44 inwardly in the direction of width to cause the latch members 43 to sink into the module body 42, and therefore requires in the module body 42 movable space with at least the same size as the projection width of the latch members 43, which results in the problem of large dimensions of the latch mechanism, and difficulty in size reduction.

With the above electronic module 41, there is also the problem that the latch members 43 cannot be disengaged from the cage 40 with weak force of pinching the arms 44, and the electronic module 41 cannot therefore be easily and smoothly pulled and removed.

SUMMARY OF THE INVENTION

Accordingly, it is an object of the present invention to provide an electronic module capable of obviating the above problems, reducing space required for a latch mechanism, and effectively using packaging space.

(1) According to one aspect of the invention, an electronic module comprises:

a module body for being removably inserted into a cage;

a latch member provided in the module body for engaging an engagement hole formed in the cage during insertion into the cage;

a rotatable nail for engaging/disengaging the engagement hole of the cage and being rotatably provided in the module body so as to appear above and sink below a module body surface; and a control member provided in the module body for rotating the rotatable nail.

In the above invention (1), the following modifications and changes can be made.

(a) The control member comprises a sleeve for surrounding the insertion rear end of the module body, and the rotatable nail rotatably provided in the module body accommodated in the cage for engaging the engagement hole of the cage, and the sleeve has an arm that, during sliding in the insertion direction, engages an inner nail portion of the rotatable nail for regulating the rotation of the rotatable nail.

(b) Between the sleeve and the module body, there is provided a spring that biases the sleeve in the insertion direction.

(2) According to another aspect of the invention, an electronic module comprises:

a module body for being removably inserted into a cage;

a latch member provided in the module body for engaging an engagement hole formed in the cage during insertion into the cage;

a slidable nail for engaging/disengaging the engagement hole of the cage and being slidably provided in the module body so as to rotate and appear above and sink below a module body surface; and a control member provided in the module body for sliding the slidable nail.

In the above invention (2), the following modifications and changes can be made.

The control member comprises the sleeve for surrounding the insertion rear end of the module body, and the spring connected to the sleeve and the slidable nail for biasing the slidable nail to outside the module body, and the module body is provided with a guide for rotating and sliding the slidable nail.

ADVANTAGES OF THE INVENTION

According to the present invention, it is possible to reduce space required for a latch mechanism, and effectively use packaging space.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
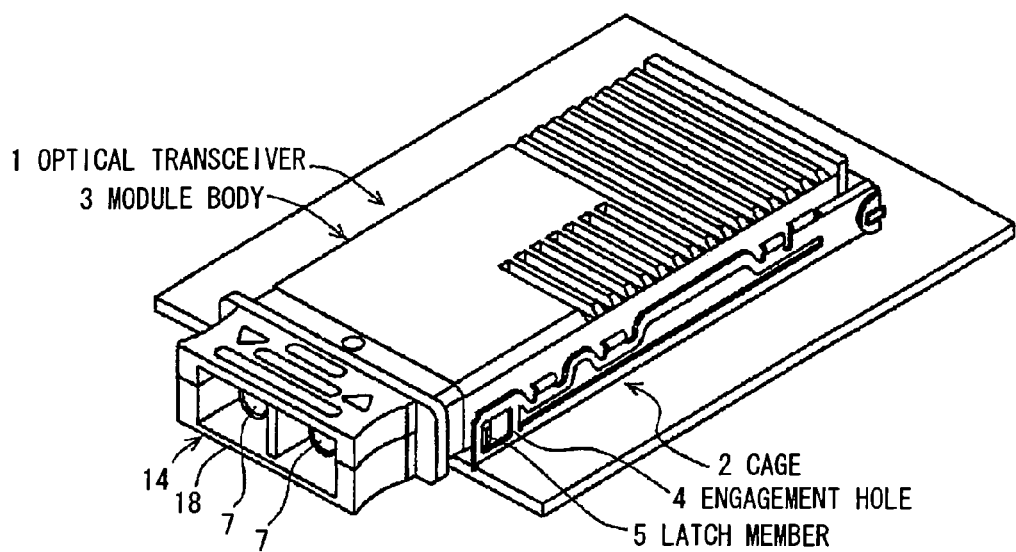
FIG. 1 is a perspective view of an optical transceiver mounted to a cage.
Figure 2:
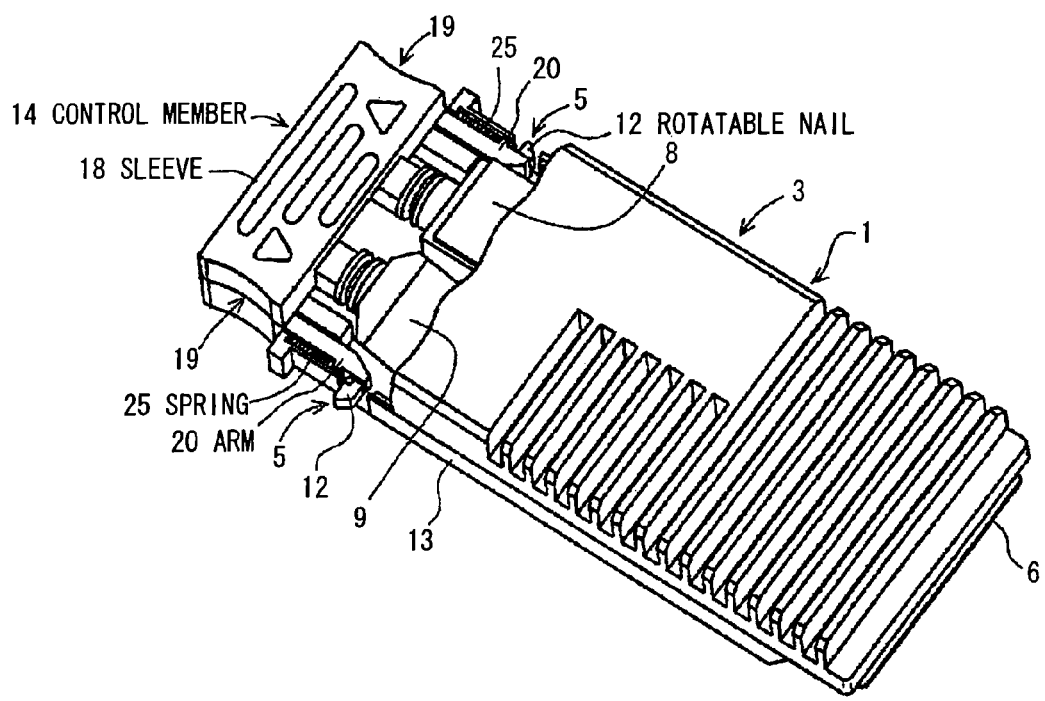
FIG. 2 is a perspective view of the optical transceiver from which an upper portion of a chassis is removed.

FIGS. 1 and 2 show an optical transceiver that serves as an electronic module. This optical transceiver 1 includes a module body 3 provided to be removably inserted into a cage 2. The module body 3 includes a latch member 5 which engages an engagement hole 4 formed in the cage 2 during insertion into the cage 2.

The cage 2 has standard dimensions and shape. It has on both sides the engagement hole 4 for locking the optical transceiver 1, and thereinside a connector (not shown) to be electrically connected to the optical transceiver 1.

The module body 3 is formed in a long box shape in an insertion direction. It has at an insertion fore-end a card edge 6 connected to the connector inside the cage 2, and at an insertion rear end an optical connector 7 connected to an optical cable (not shown). The module body 3 also has thereinside a small-size transmitter optical sub-assembly (TOSA) 8, a small-size receiver optical sub-assembly (ROSA) 9 and a plurality of circuit substrates (not shown) connected to these optical sub-assemblies 8 and 9. The module body 3 further has a rotatable nail 12 which serves as the latch member 5 for engaging/disengaging the engagement hole 4 in the cage 2 and which is rotatably provided to appear above/sink below a module body surface 13, and a control member 14 which rotates the rotatable nail 12.

Figure 3:
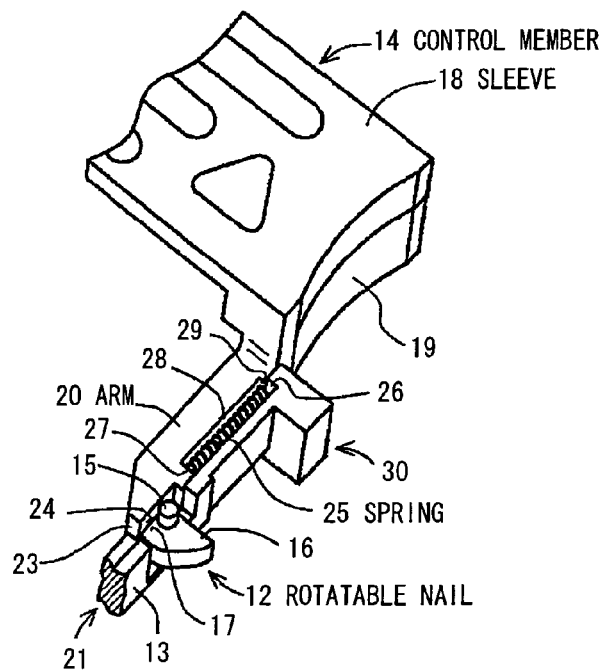
FIG. 3 is a perspective view of the optical transceiver, an essential portion of which is enlarged.
Figure 4:
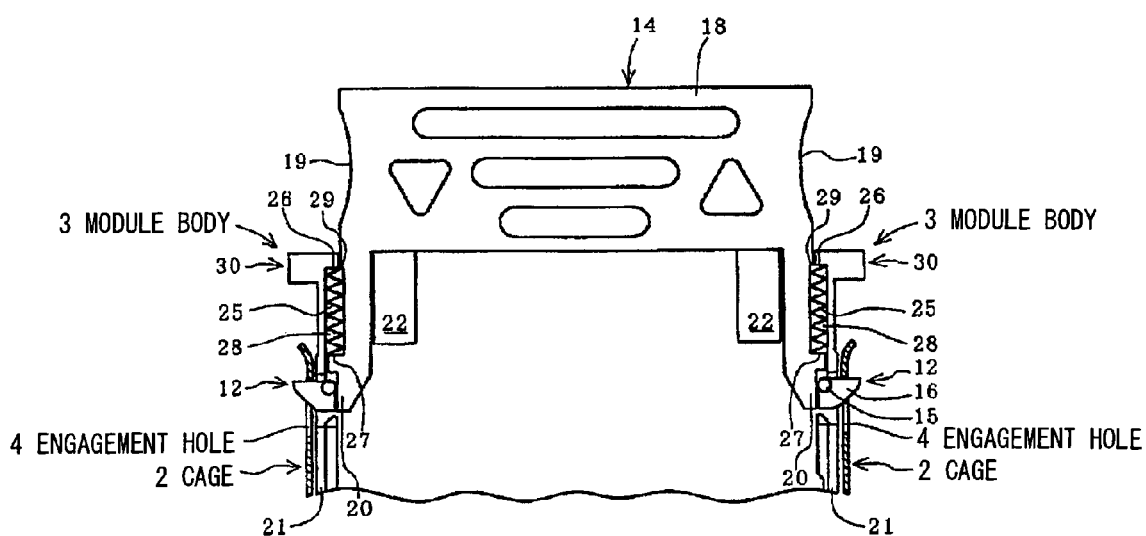
FIG. 4 is a plan view of an optical transceiver mounted to a cage.

As shown in FIGS. 3 and 4, the rotatable nail 12 includes a rotation shaft 15 pivotal to the module body 3, an outer nail portion 16 formed to radially project from the rotation shaft 15 for engaging the engagement hole 4 of the cage 2, and an inner nail portion 17 formed to radially project from the rotation shaft 15 for engaging the control member 14, as will be described later. The axial middle portion of the rotation shaft 15 is formed in a substantially fan shape which radially extends in 2 directions. The inner nail portion 17 is formed to extend in a radial direction smaller than the outer nail portion 16 to cross the outer nail portion 16 substantially at a right angle. The rotatable nail 12 is provided on both sides inside the module body 3 and rotatably around the longitudinal axis at a position to engage the engagement hole 4 of the cage 2. The rotation shaft 15 of the rotatable nail 12 is positioned to face an outside wall of the module body 3 so as to minimize the required lengths of the outer and inner nail portions 16 and 17.

The control member 14 includes a sleeve 18 which surrounds the insertion rear end of the module body 3. The sleeve 18 is formed in a rectangular frame shape when viewed from the front, and has the pair of right and left optical connectors 7 to be positioned thereinside. On both sides of the sleeve 18, there is formed a pinch portion 19 recessed in the axial middle, so that the sleeve 18 is pinched from both its sides to control slide in the insertion/removal direction. The sleeve 18 also has an arm 20 that, during sliding in the insertion direction, engages the inner nail portion 17 of the rotatable nail 12 for regulating rotation of the rotatable nail 12. The arm 20 is formed to extend from both sides of the sleeve 18 in the insertion direction, and is accommodated slidably in the insertion/removal direction inside the module body 3. Specifically, the arm 20 is formed to slide along a chassis 21 that constitutes an outer shell of the module body 3. Also, inside the module body 3, there is provided a guide member 22 for guiding the arm 20 from inside so as to slide the arm 20 stably. At the insertion tip of the arm 20, there is formed a push surface 23 to be brought into contact with the inner nail portion 17 for pushing the inner nail portion 17 in the insertion direction when the rotatable nail 12 sinks inside the module body 3. Also, in a side surface of the insertion tip of the arm 20, there is formed a lock surface 24 that is brought into contact with the inner nail portion 17 for regulating rotation of the rotatable nail 12 when the outer nail portion 16 of the rotatable nail 12 projects outside the module body 3. The lock surface 24 is formed so that its side surface recedes inwardly along a periphery of the rotation shaft 15 of the rotatable nail 12 when the arm 20 slides in the insertion direction.

Between the sleeve 18 and the module body 3, there is provided a spring 25 that biases the sleeve 18 in the insertion direction. Specifically, the spring 25 comprises a coil spring, which engages insertion rear-end inner surface 26 of the chassis 21 at one end, and insertion tip stepped surface 27 of the arm 20 at the other. The stepped surface 27 is formed at the insertion tip in a groove 28 formed to extend in the insertion/removal direction in a side surface of the arm 20. The spring 25 is partially accommodated in the groove 28. The insertion rear end surface 29 of the groove 28 is formed to be integral with the insertion rear-end inner surface 26 of the chassis 21 when the sleeve 18 slides sufficiently toward the insertion tip and locks the rotatable nail 12. The insertion rear end surface 29 engages one end of the spring 25. This, when the sleeve 18 slides sufficiently toward the insertion tip, allows both ends of the spring 25 to be locked by the inner surfaces 27 and 29 of the groove 28 opposite each other, thereby preventing the sleeve 18 from being excessively pressed in the insertion direction.

A flange 30 which projects to both sides is formed at the insertion rear end of the chassis 21, so that the sleeve 18 is pinched and pressed, thereby allowing the slide state of the sleeve 18 towards the insertion rear end to be easily kept.

Next, operation of this embodiment will be described.

Figure 5:
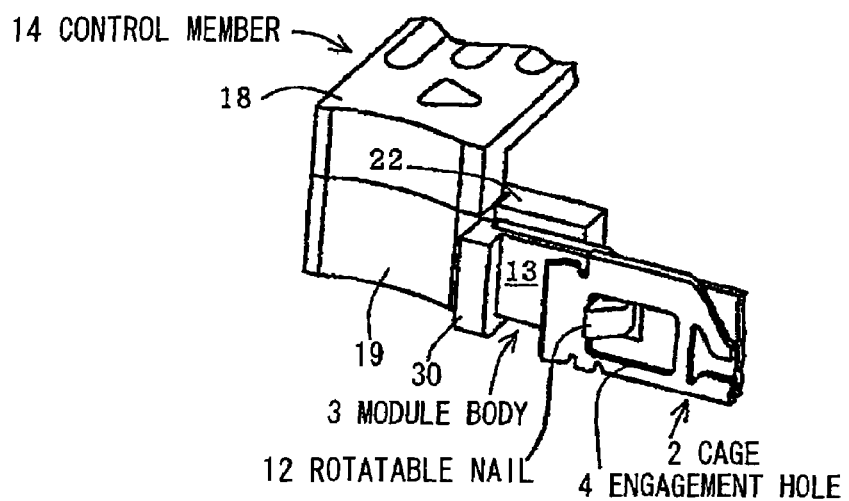
FIG. 5 is an essential portion enlarged perspective view of FIG. 4.

As shown in FIGS. 4 and 5, with the outer nail portion 16 engaging the engagement hole 4 of the cage 2, an optical cable connected to an optical connector is pulled and force acts on the module body 3 in the pulled-and-removed direction, so that the outer nail portion 16 of the rotatable nail 12 is brought into contact with an edge of the engagement hole 4, pushing the module body 3 in the insertion direction. Although the rotatable nail 12 tends to be rotated about the rotation shaft 15, it comes into contact with the arm 20 to regulate its rotation. This prevents disengagement of the rotatable nail 12 from the engagement hole 4, and therefore disengagement of an optical transceiver 1 from the cage 2.

Figure 6:
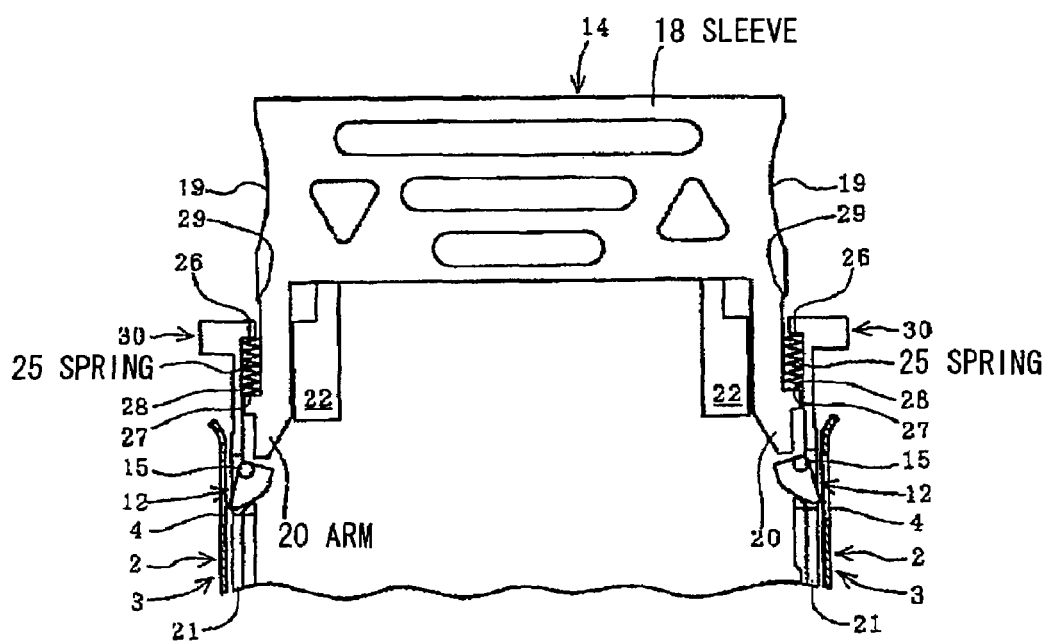
FIG. 6 is a plan view of an optical transceiver pulled and removed from a cage.
Figure 7:
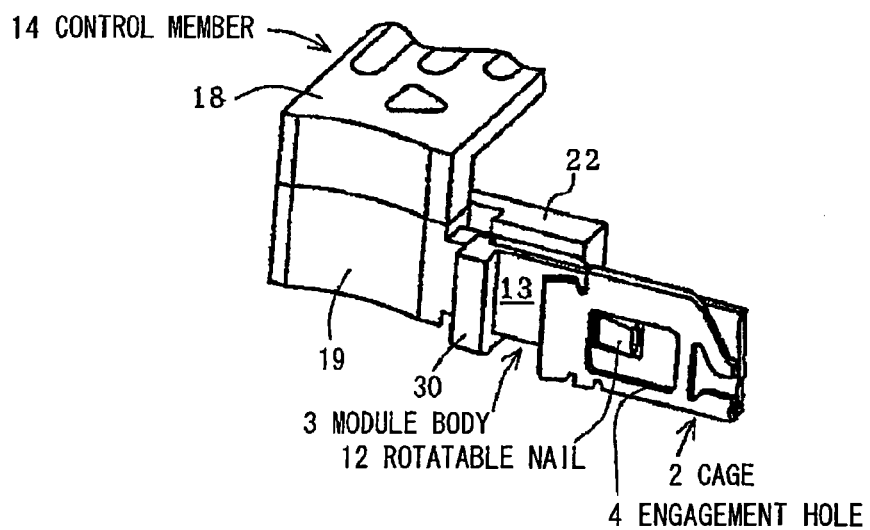
FIG. 7 is an essential portion enlarged perspective view of FIG. 6.

As shown in FIGS. 6 and 7, when the optical transceiver 1 is removed from the cage 2, the sleeve 18 is pinched with fingers and pulled. When the sleeve 18 begins to be first pulled, the module body 3 cannot move relative to the cage 2 because it is fastened to the cage 2 with the rotatable nail 12, only the sleeve 18 slides relative to the module body 3. When the sleeve 18 slides to a specified position, and the arm 20 is separated from the inner nail portion 17 of the rotatable nail 12, the lock of the rotatable nail 12 is released so that the rotatable nail 12 is rotatable. This allows the rotatable nail 12, which is brought into contact with the inner edge of the engagement hole 4 of the cage 2 for stopping movement of the module body 3, to be rotated by force received from the cage 2, and be sunk inside the module body 3. The module body 3 is slidable relative to the cage 2 and the optical transceiver 1 can thereby be pulled and removed from the cage 2. In this case, by pinching the sleeve 18 and pushing the flange 30 of the chassis 21 in the insertion direction, it is possible to prevent the module body 3 from abruptly moving towards the sleeve 18 with spring 25 force. By releasing hands from the sleeve 18 and the flange 30, the sleeve 18 is moved in the insertion direction of the module body 3 with spring 25 force, to re-regulate rotation of the rotatable nail 12.

In this manner, since the optical transceiver 1 includes the rotatable nail 12 for engaging/disengaging the engagement hole 4 of the cage 2, and being rotatably provided in the module body 3 so as to appear above/sink below the module body surface 13, and the control member 14 provided in the module body 3 for rotating the rotatable nail 12, space may be prepared in the module body 3 for only the rotatable nail 12 being rotatable, thereby allowing reducing required space for latch member 5 movement, and effectively using packaging space.

Since the control member 14 comprises the sleeve 18 for surrounding the insertion rear end of the module body 3, and the rotatable nail 12 rotatably provided in the module body 3 accommodated in the cage 2 for engaging the engagement hole 4 of the cage 2, and the sleeve 18 has the arm 20 that, during sliding in the insertion direction, engages the inner nail portion 17 of the rotatable nail 12 for regulating rotation of the rotatable nail 12, the lock of the rotatable nail 12 can be released by pulling the sleeve 18. Since the removal of the module body 3 is done in common with lock releasing, the optical transceiver 1 can be pulled out of the cage 2 without deliberation, so as to be easily and smoothly removed from the cage 2. The rotatable nail 12 is securely lockable or unlockable with the simple mechanism.

Since between the sleeve 18 and the module body 3, there is provided a spring 25 that biases the sleeve 18 in the insertion direction, the sleeve 18 is securely slidable in the insertion direction during insertion of the module body 3 into the cage 2, so that the rotation of the rotatable nail 12 is securely lockable.

Although the example of the cage 2 with the engagement hole 4 on both sides and the optical transceiver 1 mounted to the cage 2 is explained, the present invention is not limited thereto. The cage may be standardized to have the engagement hole 4 on any of its upper, lower, right or left side, in which there may be formed one or plural engagement holes 4. In this case, the optical transceiver may have the rotatable nail 12 whose position is modified to match the standard of the cage. The optical transceiver 1 may comprise any other type electronic module.

Also, although the rotatable nail 12 has been formed in a substantially fan shape, it may be formed in another shape such as a triangular or L shape with the outer and inner nail portions 16 and 17.

Although the spring 25 has been composed of a coil spring, it may be composed of another type of spring such as a plate spring.

Another embodiment will be explained.

Figure 8:
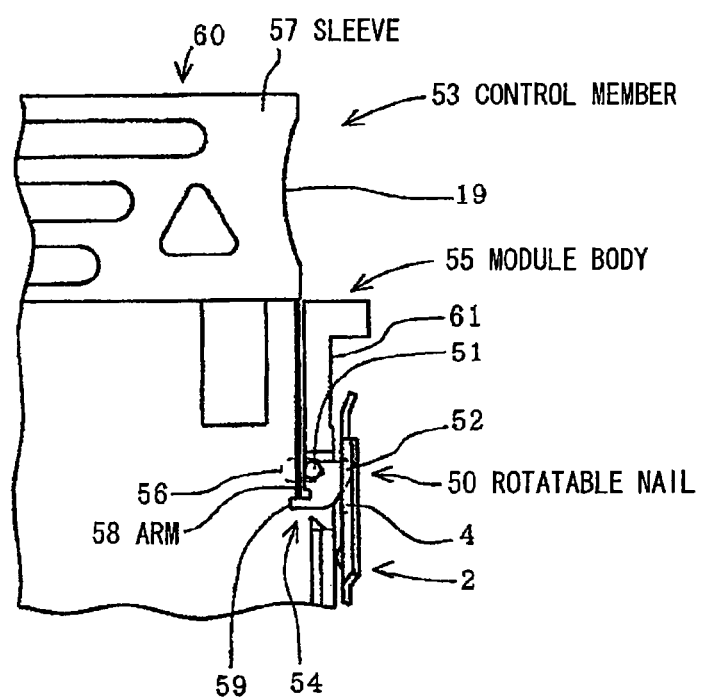
FIG. 8 is a plan view of an essential portion of an optical transceiver showing another embodiment.
Figure 9:
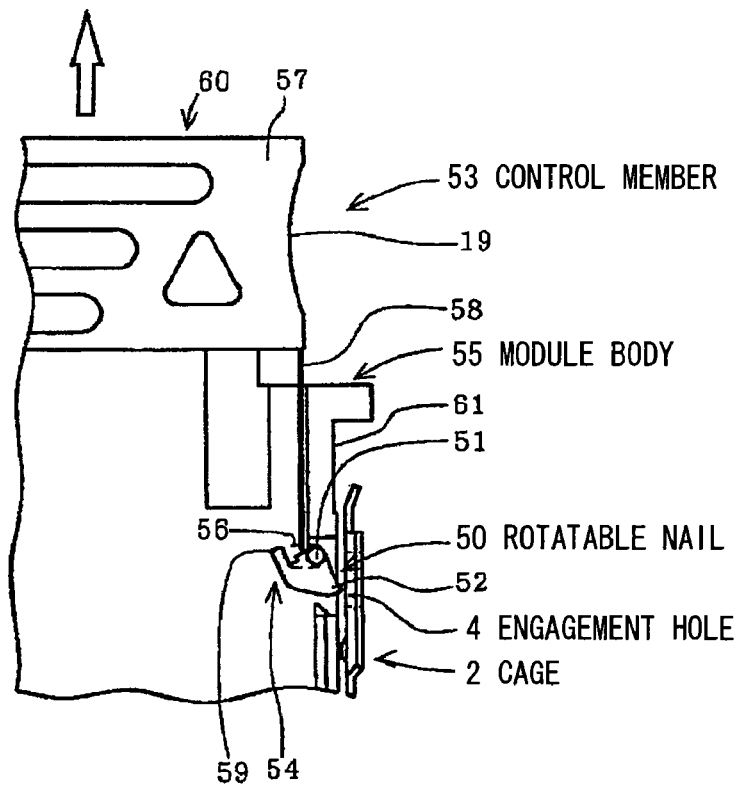
FIG. 9 is a plan view of an essential portion of an optical transceiver showing another embodiment.
Figure 10:
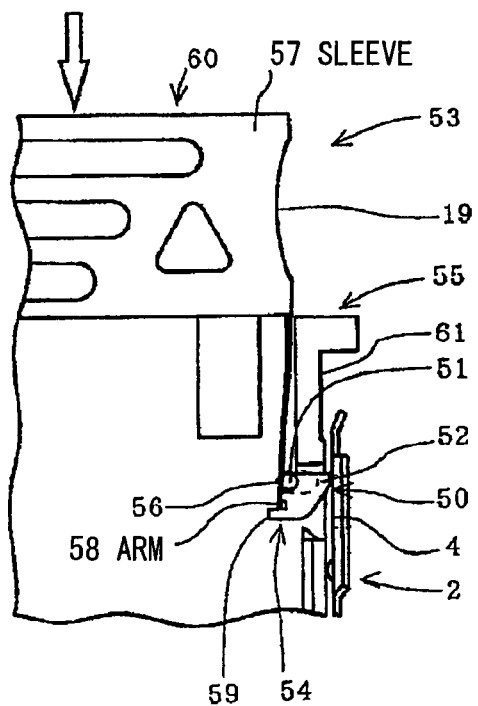
FIG. 10 is a plan view of an essential portion of an optical transceiver showing another embodiment.

FIGS. 8, 9 and 10 are plan views of an essential portion of an optical transceiver showing another embodiment. FIG. 8 shows mounting to a cage, FIG. 9 pulling out of the cage, and FIG. 10 inserting into the cage.

This embodiment shows modification of the rotatable nail 12 and the control member 14 of the above embodiment. The other analogous configuration is denoted by the same numerals and its explanation is omitted.

As shown in FIG. 8, a rotatable nail 50 includes a rotation shaft 51 pivotal to a module body 55 and movable in its width direction, an outer nail portion 52 formed to radially project from the rotation shaft 51 for engaging the engagement hole 4 of the cage 2, and an inner nail portion 54 formed to radially project from the rotation shaft 51 for engaging a control member 53, as will be described later. The rotatable nail 50 is rotatably provided to appear above/sink below a module body surface 61. The rotation shaft 51 is inserted into an elongated hole 56 with both ends formed in the module body 55, so as to be movable in its width direction. The rotation shaft 51 is moved inwardly in its width direction so that the rotatable nail 50 sinks inside the module body 55. The inner nail portion 54 is formed to extend in a radial direction smaller than the outer nail portion 52 to cross the outer nail portion 52 substantially at right angle, and to be bent in a hook form to extend its tip in the module body 55. Also, the rotation shaft 51 of the rotatable nail 50 is positioned to face an outside wall of the module body 55 so as to minimize required length of the outer and inner nail portions 52 and 54.

The control member 53 includes a sleeve 57 which surrounds the insertion rear end of the module body 55. The sleeve 57 is formed in a rectangular frame shape when viewed from the front, and has the pair of right and left optical connectors 7 (not shown) to be positioned thereinside. The sleeve 57 is slid axially by pinching a pinch portion 19 on both sides and adding force in the insertion/removal direction. Also, the sleeve 57 has an arm 58 that, during sliding in the insertion direction, engages the inner nail portion 54 of the rotatable nail 51 for regulating rotation of the rotatable nail 51. The arm 58 comprises a plate spring and is formed to extend from both sides of the sleeve 57 in the insertion direction. The plate surface of the arm 58 faces towards a side so as to spring-wise bend its insertion tip in its width direction. The arm 58 spring-biases the rotatable nail 51 outwardly in the width direction while allowing inward movement of the rotation shaft 51 in the width direction. When the arm 58 is sunk in the module body 55, the inner nail portion 54 of the rotatable nail 50 is brought into contact with the side surface of the arm 58, while a hook 59 of the inner nail portion 54 is brought into contact with the tip of the arm 58. This allows the side surface of the arm 58 to receive force during pushing the rotatable nail 50 inwardly in the width direction to be bent, and the rotatable nail 50 to sink in the module body 55, while regulating rotation of the rotatable nail 50 in the insertion direction of the outer nail portion 52.

Between the sleeve 57 and the module body 55, there is provided a return spring (not shown) that biases the sleeve 57 in the insertion direction. Specifically, the return spring is positioned in the sleeve 57.

Next, operation of this embodiment will be described.

As shown in FIG. 8, with the outer nail portion 52 engaging the engagement hole 4 of the cage 2, an optical cable connected to an optical connector is pulled and force acts on the module body 55 in the pulled-and-removed direction, so that the outer nail portion 52 of the rotatable nail 50 is brought into contact with an edge of the engagement hole 4, pushing the module body 55 in the insertion direction. Although the rotatable nail 50 tends to be rotated about the rotation shaft 51 so that the hook 59 pushes the arm 58, because the hook 59 pushes the arm 58 longitudinally, the arm 58 does not deform to regulate rotation of the rotatable nail 50. This prevents disengagement of the rotatable nail 50 from the engagement hole 4, and therefore disengagement of an optical transceiver 60 from the cage 2.

When the optical transceiver 60 is removed from the cage 2, the sleeve 57 is pinched with fingers and pulled. As shown in FIG. 9, the sleeve 57 begins to slide in the removal direction relative to the module body 55, and the arm 58 is separated from the hook 59 of the rotatable nail 50. This allows the rotatable nail 50 to be rotated. When the module body 55 begins to slide relative to the cage 2, the rotatable nail 50 is pushed and rotated to the edge of the engagement hole 4 to sink in the module body 55, so that the optical transceiver 60 can be easily pulled out of the cage 2. Subsequently, by releasing hands from the sleeve 57, the sleeve 57 is moved in the insertion direction of the module body 55 with return spring force thereinside, to re-regulate rotation of the rotatable nail 50.

Also, when the optical transceiver 60 is mounted to the cage 2, by pinching the sleeve 57 with fingers, the optical transceiver 60 is inserted into the cage 2. When the optical transceiver 60 is inserted by a specified length, although the outer nail portion 52 of the rotatable nail 50 comes into contact with an insertion slot of the cage 2, the arm 58 is bent inwardly in the width direction to allow movement of the rotatable nail 50 in the width direction, and the rotatable nail 50 to thereby be sunk in the module body 55, so that the optical transceiver 60 cannot be blocked from being inserted.

When the optical transceiver 60 is inserted further deep so that the rotatable nail 50 reaches the engagement hole 4 of the cage 2, the rotatable nail 50 is pushed out of the module body 55 by spring force of the arm 58, and inserted into the engagement hole 4. This allows the optical transceiver 60 to be locked to the cage 2 by the rotatable nail 50 and mounted thereto.

In this manner, since the optical transceiver 60 includes the rotatable nail 50 for engaging/disengaging the engagement hole 4 of the cage 2, and being rotatably provided in the module body 55 so as to appear above/sink below the module body surface 61, and the control member 53 provided in the module body 55 for rotating the rotatable nail 50, space may be prepared in the module body 3 for only the rotatable nail 12 being rotatable, thereby allowing reducing required space for the latch mechanism, and effectively using packaging space.

Since the control member 53 comprises the sleeve 57 for surrounding the insertion rear end of the module body 55, and the rotatable nail 50 rotatably provided in the module body 55 accommodated in the cage 2 for engaging the engagement hole 4 of the cage 2, and the sleeve 57 has the arm 58 that, during sliding in the insertion direction, engages the hook 59 of the inner nail portion 54 of the rotatable nail 50 for regulating rotation of the rotatable nail 50, the lock of the rotatable nail 50 can be released by pulling the sleeve 57. Since the removal of the module body 55 is done in common with lock releasing, the optical transceiver 60 can be pulled out of the cage 2 without deliberation, so as to be easily and smoothly removed from the cage 2. The rotatable nail 50 is securely lockable or unlockable with the simple mechanism.

Another embodiment will be explained.

Figure 11:
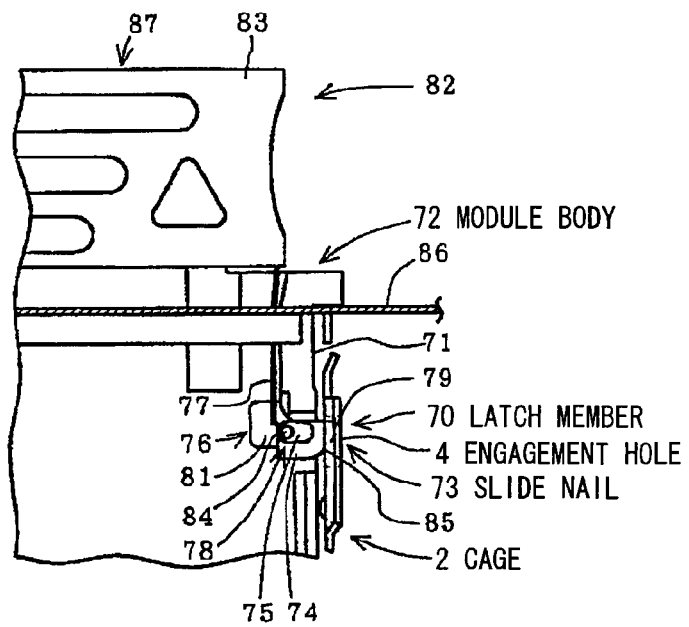
FIG. 11 is a plan view of an essential portion of an optical transceiver showing another embodiment.
Figure 12:
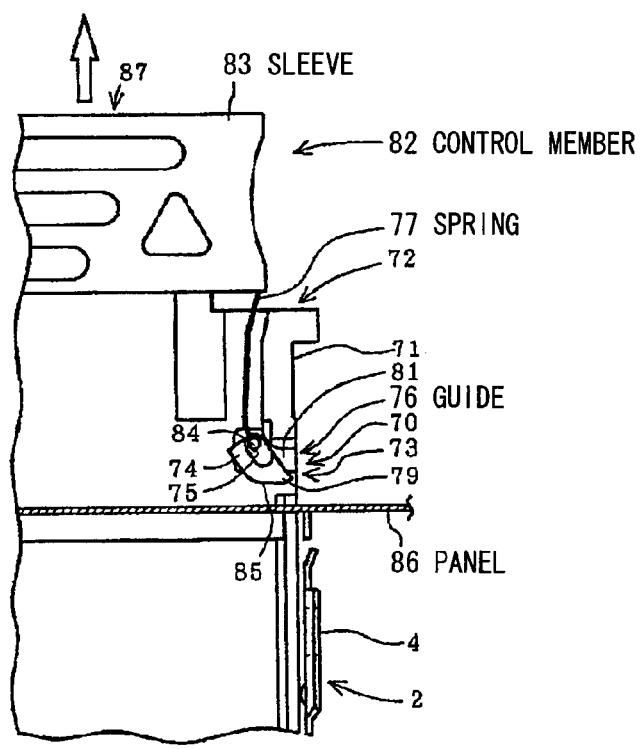
FIG. 12 is a plan view of an essential portion of an optical transceiver showing another embodiment.
Figure 13:
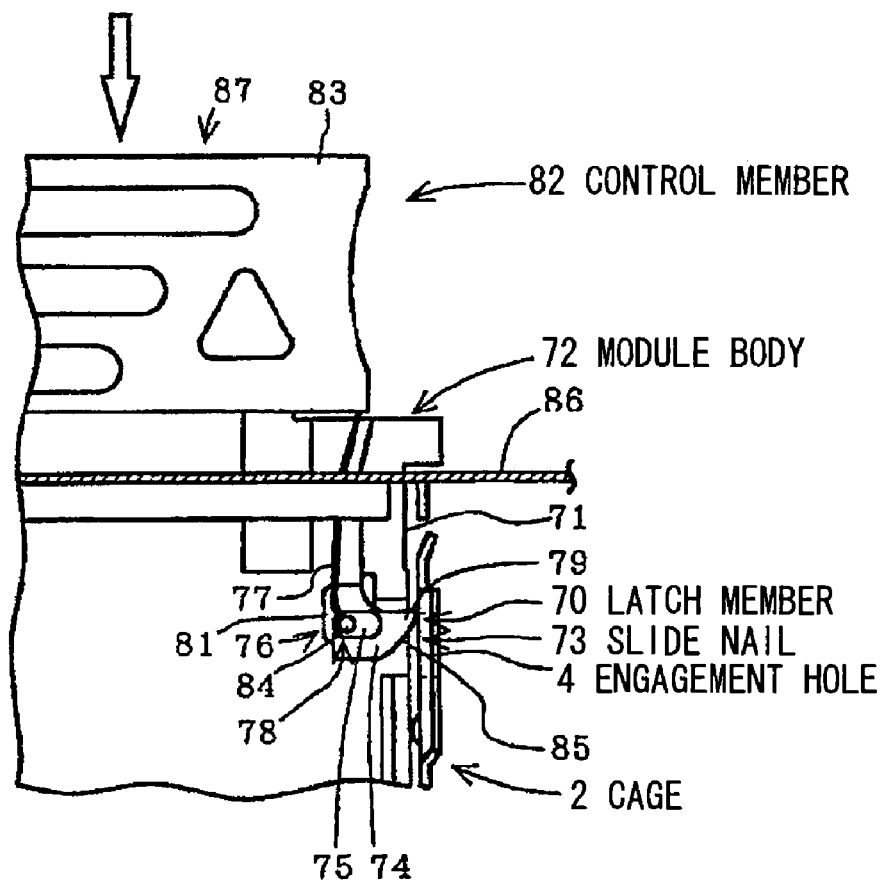
FIG. 13 is a plan view of an essential portion of an optical transceiver showing another embodiment.

FIGS. 11, 12 and 13 are plan views of an essential portion of an optical transceiver showing another embodiment. FIG. 11 shows mounting to a cage, FIG. 12 pulling out of the cage, and FIG. 13 inserting into the cage.

This embodiment shows modification of the latch member 5 and the control member 14 of the above embodiment. The other analogous configuration is denoted by the same numerals and its explanation is omitted.

As shown in FIG. 11, a latch member 70 comprises a slide nail 73 slidably provided in a module body 72 to rotate and appear above/sink below a module body surface 71, and is provided on both sides of the module body 72.

Figure 14:
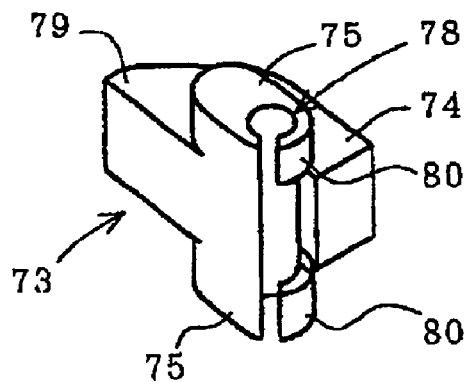
FIG. 14 is a perspective view of a slide nail showing another embodiment.
Figure 15:
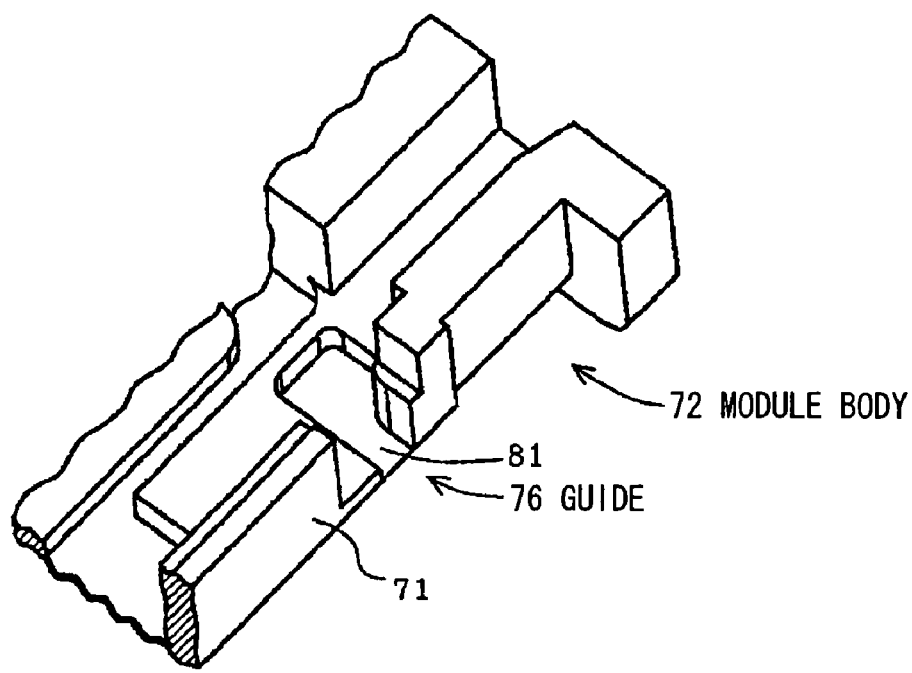
FIG. 15 is a perspective view of an essential portion of a module body showing another embodiment.
Figure 16:
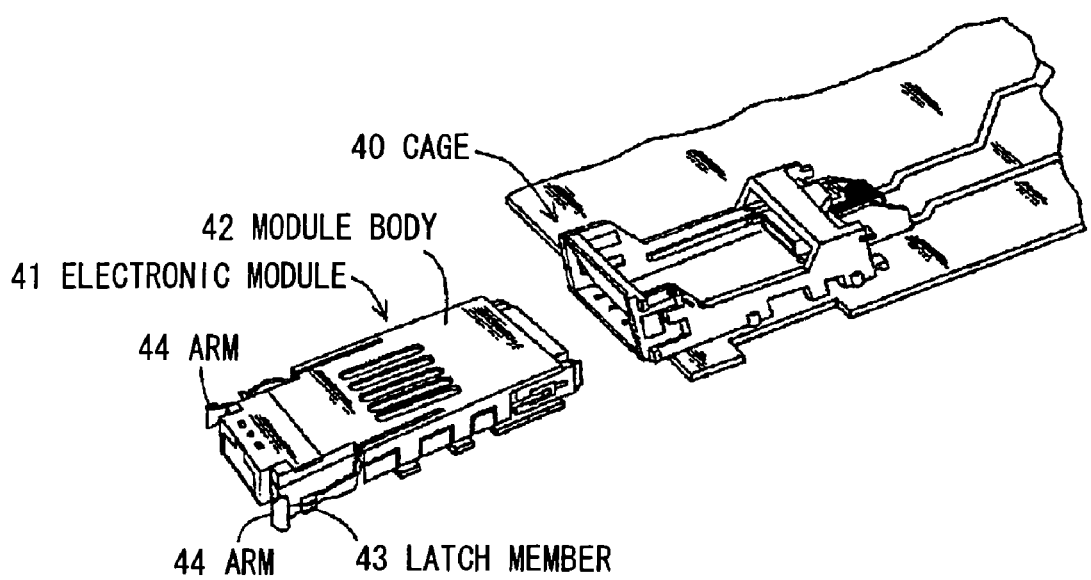
FIG. 16 is a perspective view of a conventional electronic module.

As shown in FIGS. 13 and 14, the slide nail 73 comprises a block-shaped nail body portion 74 for engaging the engagement hole 4 of the cage 2, and an elongated columnar sliding portion 75 provided in the nail body portion 74 for coming into sliding contact with the module body 72. The sliding portion 75 is provided to extend symmetrically on upper, lower, and both sides of the nail body portion 74, and to slide along respective guides 76 provided in the module body 72. Particularly, the cross section of the sliding portion 75 is formed in an elongated circular shape for having flat surfaces on both its peripheral sides respectively, and a curved surface for connecting both ends of the flat surfaces. The rotation of these flat surfaces is regulated by a guide groove 81, or is guided to rotate the curved surface, as will be explained later. The nail body portion 74 is formed to project radially from the sliding portion 75, and has a nail portion 79 that is inserted into the engagement hole 4. An insertion surface 85 of the nail portion 79 is inclined to recede rearwardly in the insertion direction towards its tip, to cause force component in the width direction to act on the slide nail 73 when brought into contact with the cage 2 or a panel 86 of a host device that accommodates the cage 2. Also, the slide nail 73 is provided with a connection portion 78 for rotatably connecting a spring 77, as will be explained later. Specifically, the connection portion 78 comprises a plurality of arcuate nails 80 that pivot an end of the spring 77. As shown in FIGS. 13 and 15, the guide 76 forms in the module body 72 a guide groove 81 for guiding the sliding portion 75. The guide groove 81 is formed to be bent in a hook form when viewed from top, and arcuately rounded in the bent portion. During inward movement of the sliding portion 75 in the width direction, the guide groove 81 guides the sliding portion 75 in the pulled-and-removed direction, and rotates the sliding portion 75 to turn the nail portion 79 in the insertion direction. Also, the guide groove 81 is formed with substantially the same depth as vertical length of the sliding portion 75, to sandwich the nail body portion 74 between the upper and lower module bodies 72 and guide it.

As shown in FIG. 11, the control member 82 includes a sleeve 83 for surrounding the insertion rear end of the module body 72, and a spring 77 connected to the sleeve 83 and the slide nail 73 for biasing the slide nail 73 to outside the module body 72. The control member 82 moves in the insertion/removal direction relative to the module body 72, to thereby slide the slide nail 73. The sleeve 83 is formed in a rectangular frame shape when viewed from the front, and has an optical connector (not shown) to be positioned thereinside. The spring 77 comprises a plate spring that is bendable in the width direction, and is connected to both sides of the sleeve 83, and to the slide nail 73. Specifically, at the slide nail 73 side end of the spring 77, there is provided a shaft 84 that extends to project upwardly and downwardly, so that both ends of the shaft 84 rotatably engage the arcuate nails 80 of the slide nail 73. Also, between the sleeve 83 and the module body 72, there is provided a return spring (not shown) that biases the sleeve 83 in the insertion direction. Specifically, the return spring is positioned in the sleeve 83.

Next, operation of this embodiment will be described.

As shown in FIG. 11, with the nail portion 79 of the slide nail 73 engaging the engagement hole 4 of the cage 2, an optical cable connected to an optical connector is pulled and force acts on the module body 72 in the pulled-and-removed direction, so that the nail portion 79 is brought into contact with an edge of the engagement hole 4, pushing the module body 72 in the insertion direction. Although force in a rotation direction acts on the slide nail 73 and sliding portion 75, because the sliding portion 75 is formed in an elongated circular shape and both its planar sides are in contact with the guide groove 81, its rotation is regulated by the guide groove 81, so as not to rotate the slide nail 73. This prevents disengagement of the slide nail 73 from the engagement hole 4, and therefore disengagement of an optical transceiver 87 from the cage 2.

When the optical transceiver 87 is removed from the cage 2, the sleeve 83 is pinched with fingers and pulled. As shown in FIG. 12, the sleeve 83 begins to slide in the removal direction relative to the module body 72, and the slide nail 73 is pulled along with the spring 77. The slide nail 73 is moved along the guide groove 81 inwardly in the width direction, and in the removal direction. With this sliding, the slide nail 73 is rotated to turn the nail portion 79 in the insertion direction, so that the slide nail 73 pushes and bends the spring 77 inwardly in the width direction. This causes the slide nail 73 to be sunk in the module body 72, so that the optical transceiver 87 can be easily pulled out of the cage 2. Particularly, because the slide nail 73 is rotated to turn the nail portion 79 in the insertion direction, linear sliding of the slide nail 73 allows accommodation space of the slide nail 73 formed in the module body 72 to be reduced in the width direction, while preventing the slide nail 73 from hooking the engagement hole 4 of the cage 2, so that the optical transceiver 87 can be pulled out smoothly. Subsequently, by releasing hands from the sleeve 83, the sleeve 83 is moved in the insertion direction of the module body 72 with return spring force, to re-regulate rotation of the rotatable nail 50, while the slide nail 73 is pushed outwardly in the width direction by spring 77 force, and slid along the guide groove 81, so that the slide nail 73 is caused to re-project outside the module body 72.

Also, when the optical transceiver 87 is mounted to the cage 2, by pinching the sleeve 83 with fingers, the optical transceiver 87 is inserted into the cage 2. In this case, although the nail portion 79 of the slide nail 73 comes into contact with the panel 86 of the host device, because the insertion surface 85 of the nail portion 79 is inclined, the slide nail 73 is sunk in the module body 72 with the insertion surface 85 of the nail portion 79 brought into sliding contact with an opening edge of the panel 86. The slide nail 73 passes through the panel 86, and again comes into contact with an insertion slot of the cage 2 while being sunk in the module body 72. In this case, the slide nail 73 pushes and bends the spring 77 inwardly in the width direction of the module body 72.

When the slide nail 73 reaches the engagement hole 4 of the cage 2, the slide nail 73 is pushed out of the module body 72 by spring 77 force, and inserted into the engagement hole 4. This allows the optical transceiver 87 to be locked to the cage 2 by the slide nail 73 and mounted thereto.

In this manner, since the optical transceiver 87 includes the slide nail 73 for engaging/disengaging the engagement hole 4 of the cage 2, and being slidably provided in the module body 72 so as to rotate and appear above/sink below the module body surface 71, and the control member 82 provided in the module body 72 for sliding the slide nail 73, space may be prepared in the module body 72 for only the slide nail 73 being rotated and sunk therein, thereby allowing reducing required space for latch member 70 movement, and effectively using packaging space.

Since the control member 82 comprises the sleeve 83 for surrounding the insertion rear end of the module body 72, and the spring 77 connected to the sleeve 83 and the slide nail 73 for biasing the slide nail 73 to outside the module body 72, and the module body 72 is provided with the guide 76 for rotating and sliding the slide nail 73, the lock of the slide nail 73 can easily be released by pulling the sleeve 83. Since the removal of the module body 72 is done in common with lock releasing, the optical transceiver 87 can be pulled out of the cage 2 without deliberation, so as to be easily and smoothly removed from the cage 2. The slide nail 73 is securely lockable or unlockable with the simple mechanism.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An electronic module, comprising:
   a module body for being removably inserted into a cage;
   a rotatable nail rotatably provided in the module body,
   wherein the rotatable nail serves as a latch member for engaging an engagement hole formed in the cage during insertion into the cage, wherein the rotatable nail is configured to appear above and sink below a module body surface; and
   a control member provided in the module body for rotating the rotatable nail;
   wherein the control member comprises a sleeve for surrounding an insertion rear end of the module body, and the rotatable nail rotatably provided in the module body accommodated in the cage for engaging the engagement hole of the cage, and the sleeve has an arm that, during sliding in an insertion direction, engages an inner nail portion of the rotatable nail for regulating the rotation of the rotatable nail.

2. The electronic module according to claim 1, wherein:
   a spring that biases the sleeve in the insertion direction is provided between the sleeve and the module body.

3. An electronic module, comprising:
   a module body for being removably inserted into a cage;
   a slidable nail rotatably provided in the module body,
   wherein the slidable nail serves as a latch member for engaging an engagement hole formed in the cage during insertion into the cage, wherein the slidable nail is configured to rotate and appear above and sink below a module body surface; and
   a control member provided in the module body for sliding the slidable nail,
   wherein the control member comprises a sleeve for surrounding an insertion rear end of the module body, and a spring connected to the sleeve and the slidable nail for biasing the slidable nail to outside the module body, and the module body is provided with a guide for rotating and sliding the slidable nail.

\* \* \* \* \*